United States Patent
Randall et al.

(10) Patent No.: US 8,111,524 B2
(45) Date of Patent: Feb. 7, 2012

(54) ELECTRONIC PASSIVE DEVICE

(75) Inventors: Michael S. Randall, Simpsonville, SC (US); Garry Renner, Easley, SC (US); John D. Prymak, Greer, SC (US); Azizuddin Tajuddin, Laurens, SC (US)

(73) Assignee: Kemet Electronics Corporation, Greenville, SC (US)

( * ) Notice: Subject to any disclaimer, the term of this patent is extended or adjusted under 35 U.S.C. 154(b) by 0 days.

(21) Appl. No.: 12/526,426

(22) PCT Filed: Feb. 12, 2008

(86) PCT No.: PCT/US2008/053730
§ 371 (c)(1),
(2), (4) Date: Dec. 16, 2010

(87) PCT Pub. No.: WO2008/100940
PCT Pub. Date: Aug. 21, 2008

(65) Prior Publication Data
US 2011/0096521 A1    Apr. 28, 2011

Related U.S. Application Data

(63) Continuation-in-part of application No. 11/705,260, filed on Feb. 12, 2007, now abandoned.

(60) Provisional application No. 60/904,982, filed on Mar. 5, 2007.

(51) Int. Cl.
*H05K 3/00*    (2006.01)

(52) U.S. Cl. ........ 361/782; 361/763; 361/760; 257/690; 257/730; 257/691

(58) Field of Classification Search .................. 361/760, 361/763, 782; 257/690, 730, 691; 174/250, 174/256
See application file for complete search history.

(56) References Cited

U.S. PATENT DOCUMENTS 6,807,047 B2 * 10/2004 Togashi et al. ............. 361/321.2
6,875,921 B1 * 4/2005 Conn ............................ 174/534

(Continued)

OTHER PUBLICATIONS

BAK, International Search Report and Written Opinion of ISA, PCT/US08/53730, Jun. 30, 2008.

*Primary Examiner* — Tuan T Dinh
*Assistant Examiner* — Hung Dang
(74) *Attorney, Agent, or Firm* — Joseph T. Guy, Ph.D.; Nexsen Pruet, LLC (57) ABSTRACT

A capacitive interposer, electronic package having the capacitive interposer and electronic device with the electronic package is described. The interposer has a first planar face and a second planar face. An array of upper connections is on the first planar face and opposing lower connections are on the second planar face with conduction paths between each upper connection of the upper connections and a lower connection of the lower connections. At least one power feed-through capacitor is provided. The capacitor has a plurality of parallel plates with a dielectric there between. At least one first external termination is in electrical contact with a first set of alternate parallel plates and at least one second external termination is in electrical contact with a second set of alternate parallel plates. The capacitor is mounted on the first planar face with the first external termination in direct electrical contact with a first upper connection and the second external termination is in direct electrical contact with a second upper connection. At least one upper connection, first external termination and second external termination are arranged for direct electrical contact with element contact pads of a common element.

14 Claims, 5 Drawing Sheets

U.S. PATENT DOCUMENTS

| | | | |
|---|---|---|---|
| 6,961,231 B1 * | 11/2005 | Alexander et al. | 361/321.2 |
| 7,327,554 B2 * | 2/2008 | Otsuka et al. | 361/306.3 |
| 7,518,881 B2 * | 4/2009 | Cornelius | 361/760 |
| 2005/0280146 A1 * | 12/2005 | Cornelius | 257/730 |
| 2005/0285252 A1 | 12/2005 | Nair | 257/690 |
| 2006/0012966 A1 * | 1/2006 | Chakravorty | 361/763 |

* cited by examiner

ELECTRONIC PASSIVE DEVICE

CROSS-REFERENCE TO RELATED APPLICATIONS

The application claims priority to U.S. Provisional Patent Application No. 60/904,982 filed Mar. 5, 2007 and is a continuation-in-part application of U.S. patent application Ser. No. 11/705,260 filed Feb. 12, 2007 now abandoned both of which are incorporated herein by reference.

FIELD OF THE INVENTION

The present invention is related to an electronic passive device. More specifically, the present invention is related to a monolith interposer device that may directly connect between additional devices, and which allows for direct capacitance decoupling for decreased inductance combined with power and/or signal feed-through which enables conditioning of the power sent, in a minimized device footprint, to an electronic device such as an integrated circuit, a microprocessor or the like.

BACKGROUND OF THE INVENTION

Integrated circuits (IC) containing decoupling capacitors are commonly employed in virtually all modern electronic systems. Decoupling capacitors are typically mounted between power and ground circuits to ensure stable power to the IC. For the purposes of the present invention an integrated circuit may be a discrete element, a package of multiple discrete elements, or it may be incorporated into an integrated circuit package wherein the IC package comprises additional functioning elements.

The location of decoupling capacitors has become increasingly more important as the clock speed, or switching frequencies, of modern IC's has increased. With low clock speeds, such as hundreds of kilohertz to tens of megahertz, the location is of less significance. As clock speeds approach hundreds of megahertz or higher it becomes imperative to minimize the inductance of the decoupling circuit traces such that parasitic inductance is minimized. Parasitic inductance has been reduced markedly by optimization of the component design, as well as positioning of the decoupling capacitors nearer to the IC and with use of smaller capacitors having lower inductance values. As clock speeds increase further these prior improvements will be less suitable for high speed decoupling as the associated parasitic inductances associated with these methods has largely been minimized.

Capacitive interposers situated between the IC and printed circuit board (PCB) have improved the parasitic inductance as indicated in U.S. Pat. Nos. 6,961,231 and 7,268,419. A capacitive interposer has an array of connectors on each surface. The IC, or IC package, is coupled to the interposer at the lands on one surface of the interposer. The PCB is coupled to the capacitive interposer at lands on the opposite side of the interposer. Electrically conductive vias in the capacitive interposer interconnect the lands with terminals on the opposite side. Capacitors are mounted on, or incorporated into, the capacitive interposer thereby providing the decoupling function desired.

Capacitive interposers are described throughout the literature as exemplified in U.S. Pat. Nos. 7,123,465 and 6,891,258 and U.S. Pat. Publ. Nos. 2007/0065983 and 2006/0012966. While these provide a savings in total circuit space the function contained therein is limited to capacitance and decoupling. Methods for combining elements to increase special efficiency are provided throughout the literature yet these are typically combinations of elements and the manufacturing cost of such elements is prohibitive. Exemplary references include U.S. Pat. Nos. 7,084,501; 7,006,359; 6,963,493 and 5,475,262.

Capacitive interposers are relatively thin and typically do not add significantly to the overall volume of the electronic package. It is typical in the electronics industry that each generation of advancement in electronic devices demands higher clock speeds, smaller size and increased functionality. This ongoing demand requires even further reduction in size, increased functionality as well as decreases in parasitic inductance.

SUMMARY OF THE INVENTION

It is an object of the present invention to provide improvements in capacitive and multifunctional interposers.

It is another object of the present invention to provide an interposer which provides power directly through capacitors thereby reducing the incidence of unwanted noise or perturbations in the power direct current voltage of any frequency on the power sent directly to the IC as the capacitors are configured for an electronic filtering function as well as for decoupling.

A particular feature of the present invention is the ability to increase the functionality of a capacitive interposer without an increase in the spatial footprint requirement for the IC or IC package.

These and other advantages, as will be realized, are provided in an interposer. The interposer has a first planar face and a second planar face. An array of upper connections is on the first planar face and opposing lower connections are on the second planar face with conduction paths between each upper connection of the upper connections and a lower connection of the lower connections. At least one capacitor is provided. Each capacitor has a plurality of parallel plates with a dielectric there between. At least one first external termination is in electrical contact with a first set of alternate parallel plates and at least one second external termination is in electrical contact with a second set of alternate parallel plates. Each capacitor is mounted on the first planar face with the first external termination in direct electrical contact with a first upper connection and the second external termination is in direct electrical contact with a second upper connection. At least one upper connection, first external termination and second external termination are arranged for direct electrical contact with element contact pads of a common element.

Yet another embodiment is provided in an electronic package. The electronic package has an integrated circuit with an array of IC contacts, a printed circuit board with an array of PCB contacts and an interposer between the integrated circuit and the printed circuit board. The interposer has a first planar face and a second planar face. An array of upper connections is on the first planar face and opposing lower connections are on the second planar face with conduction paths between each upper connection of the upper connections and a lower connection of the lower connections. At least one capacitor is provided. Each capacitor has a plurality of parallel plates with a dielectric there between. At least one first external termination is in electrical contact with a first set of alternate parallel plates and at least one second external termination is in electrical contact with a second set of alternate parallel plates. The capacitor is mounted on the first planar face with the first external termination in direct electrical contact with a first upper connection and the second external termination is in direct electrical contact with a second upper connection. At least one upper connection, first external termination and second external termination are in direct electrical contact with one of the array of IC contacts and the array of the PCB contacts. The lower connections are in electrical contact with one of the array of IC contacts and the array of PCB contacts different from the upper connections.

Yet another embodiment is provided in an electronic device. The electronic device has an electronic package with an integrated circuit having an array of IC contacts, at least one printed circuit board with an array of PCB contacts and an interposer between the integrated circuit and the printed circuit board. The interposer has a first planar face and a second planar face. An array of upper connections is on the first planar face and opposing lower connections are on the second planar face with conduction paths between each upper connection of the upper connections and lower connection of the lower connections. At least one capacitor is provided. The capacitor has a plurality of parallel plates with a dielectric there between. At least one first external termination is in electrical contact with a first set of alternate parallel plates. At least one second external termination is in electrical contact with a second set of alternate parallel plates. The capacitor is mounted on the first planar face with the first external termination in direct electrical contact with a first upper connection and the second external termination is in direct electrical contact with a second upper connection. At least one upper connection, the first external termination and the second external termination are in direct electrical contact with one of the array of IC contacts and the array of PCB contacts. The lower contact pads are in electrical contact with one of the array of IC contacts and the array of PCB contacts different from the upper connections. A power supply is provided for supplying power to the electronic package. An input device is provided which is capable of interfacing to provide an input signal to the electronic package. An output device is provided for sending an output signal from the electronic package.

Yet another embodiment of the invention is provided in an interposer. The interposer has a first planar face and a second planar face. An array of upper connections is on the first planar face and opposing lower connections are on the second planar face with conductivity paths between each upper connection of the upper connections and a lower connection of the lower connections wherein at least once connectivity path has functionality selected from a signal carrier, a resistor, an inductor, a varistor, a fuse, a balun and a capacitor. The interposer also has at least one feed-through capacitor with a plurality of parallel plates with a dielectric there between, at least one first external termination in electrical contact with a first set of alternate parallel plates; and at least one second external termination in electrical contact with a second set of alternate parallel plates. The feed through capacitor is electrically or physically connected to said the planar face with said the external termination in electrical contact with a first upper connection and the second external termination is in electrical contact with a second upper connection and at least one upper connection, the first external termination and the second external termination arranged for direct electrical contact with element contact pads of a common element.

Yet another embodiment is provided in an interposer with a substrate having a first face and an opposing second face and a feed through capacitor integral to the substrate wherein the feed through capacitor has first plates and second plates in parallel alternating arrangement with dielectric there between. First connectors are on the first face and second connectors are on the second face with connectivity between each first connector of the first connectors and a second connector of the second connectors. At least one first connector is in electrical contact with the first plates and at least one second connector in electrical contact with the second plates. At least one connectivity is a functional connection.

DETAILED DESCRIPTION

The present invention will be described with reference to the various figures representing preferred embodiments without limit thereto. In the figures, similar elements are numbered accordingly.

The present invention is directed to a vertical electrode electronic passive structure. In a preferred embodiment, the structure is a ceramic monolith wherein the integrated circuit is part of the package substrate. The ceramic monolith may be similar to those shown in U.S. Pat. No. 7,068,490 which is incorporated by reference herein. Due to the monolith structure, the integrated circuit is directly connected to a device. This can eliminate the need for a circuit board between the device and the interposer. In one embodiment, the integrated circuit is directly mounted to a device. In another embodiment, the integrated circuit uses wire-bonds. For Example, if the integrated circuit includes a flip chip, no wire-bonds are necessary and the flip chip is used face down and solder balls are used. To the contrary, if the integrated circuit does not include a flip chip, wire-bonds are used and the flip chip is used face up. In the latter example, no solder balls are necessary. In some embodiments of the present invention, current does not have to go through all of the electrodes. The entire structure of the present invention can be a formed into a co-fired ceramic monolith. In a particularly preferred embodiment, vertical electrodes are used. Parallel electrodes may also be used with the present invention.

An interposer is typically between an IC and a printed circuit board or printed wiring board (PCB) or the like with connectivity passing through the interposer thereby forming an electronic package. The electronic package is then utilized in an electronic device.

Figure 1:
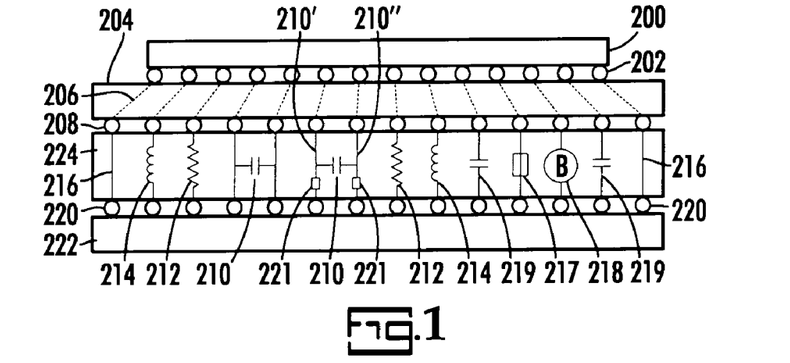
FIG. 1 is a cross-sectional schematic view of an embodiment of the present invention.

An embodiment of the invention is illustrated in schematic view in FIG. 1. In FIG. 1, an interposer, 224, is situated between a package, 204, with associated microprocessor package, 204, and a circuit board, 222. The interposer may also be between the microprocessor die, 200, and the microprocessor package, 204. The circuit board has connectors, 220, associated therewith which are in electrical contact with connectors, on the interposer, 224. For the purposes of FIG. 1, the connector between two elements is shown schematically as a single element since the purpose of a connector is to provide connectivity between the elements. The interposer has incorporated therein either a conduction path, 216, for passing signal through the interposer relatively unaltered, or a functional conduction path. Representative functional conduction paths include resistors or varistors, 212, inductors, 214, fused links, 217, baluns, 218, capacitors, 219 or additional functionality, 220, inclusive of combinations of functions. In addition the interposer has feed through capacitors, 210, associated therewith, and preferably integral to the substrate as described above with reference to FIG. 6. The feed through capacitor, 210, allows current to pass through the capacitor which filters the signal. For illustration purposes, 210' may be the power branch of the capacitor with 210" the ground branch. The power is filtered in this configuration. The package, 204, has conduction paths, 206, therein. Connectors between the interposer and package are designated, 208, and connectors between the package and microprocessor die are designated, 202. The functionality may be in a conduction path in conjunction with at least one of the power branch or ground branch of the feed through capacitor as at 221.

Figure 2:
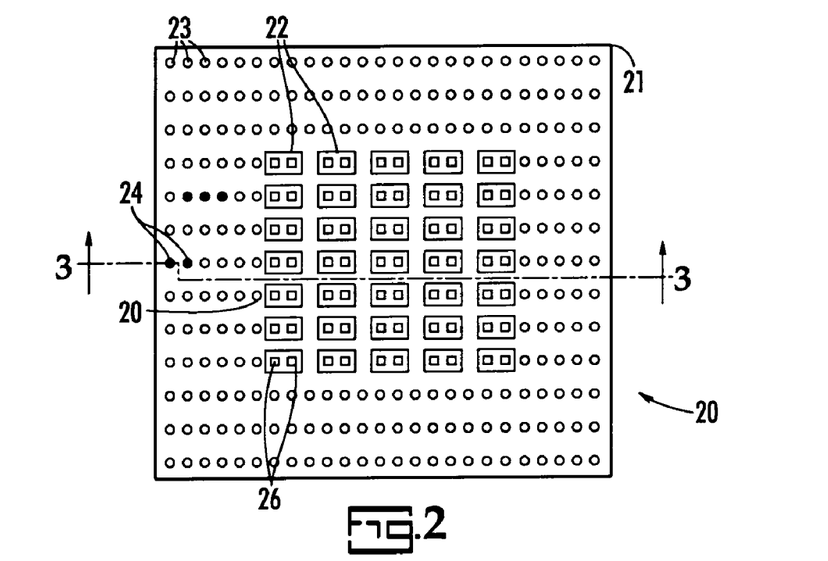
FIG. 2 is a front view schematic representation of an embodiment of the present invention.
Figure 3:
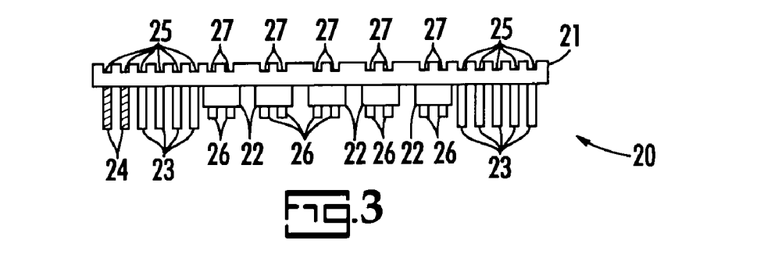
FIG. 3 is a cross-sectional view taken along line 3-3 of FIG. 2.

An interposer of the present invention is represented in top view in FIG. 2 and in cross-sectional view taken along line 3-3 in FIG. 3. The interposer, generally represented at 20, comprises a substrate, 21. A multiplicity of capacitors, 22, are mounted on the face of the substrate. At least one capacitor comprises external terminations, 26, which are in electrical contact through conductive vias or the like with a top connector, 27, on the opposite face from that on which the capacitor is mounted. Connectors on the same side of the interposer as the capacitor, 23, provide connectivity to an IC or PCB. Top connectors, 25, are preferably arranged opposite to the bottom connectors, 23, and are in electrical contact through conductive vias or the like. In FIG. 3, the connectors are illustrated as pins and socket connectors with the understanding that other connectors, such as solder balls and solder pads, PTH vias, thick film vias, vertical vias or the like, may be incorporated as well. When pins are incorporated the pins would typically be received by sockets of the IC or PCB or by a land grid array (LGA) of terminal pads and the termination of the capacitor would be in contact with pads of the IC or PCB and the sockets, 25, would receive pins from an IC or PCB's with other connectivity. Therefore, the interposer is situated between the IC and PCB with electrical conductivity directly through the interposer, either via signal circuits or directly through at least one of the capacitors for power and ground interconnection.

In a particularly preferred embodiment power from the PCB to the IC passes directly through the capacitor(s) for select components on the IC. In a particularly preferred embodiment at least one pin is a signal pin to a component and the component receives power through one external termination of a capacitor and is grounded through at least one external termination of, preferably, the same capacitor. This provides direct decoupling without the necessity of dedicated circuit traces on or in the interposer. Elimination, or reduction, of the circuit traces dedicated to power and decoupling of power provides a substantial spatial benefit and decreases parasitic inductance.

At least one pair of opposing connectors is a functional connection, 24. A functional connection, or functional connectivity, alters the signal passing there through by functioning as at least one of a resistor, an inductor, fused element, balum, capacitor, varistor or the like. By providing functional connectors select elements which would normally reside on either the IC or PCB can be eliminated due to the functionality being provided by the functional connection there between. At least one of the pair of opposing connectors can be a signal interconnect having minimal resistance or impedance properties specifically tailored to the frequency and voltage intended for signal conduction.

Figure 4:
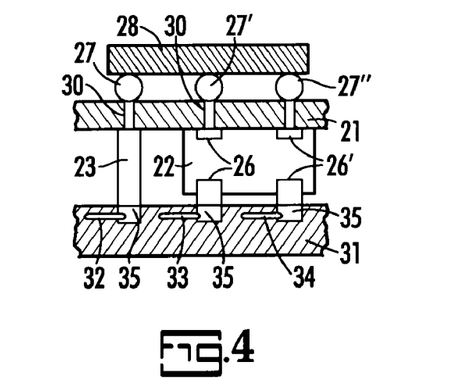
FIG. 4 is a partial cross-sectional schematic view of an embodiment of the present invention.

A partial cross-sectional view of an embodiment of the invention is illustrated in FIG. 4. In FIG. 4 the substrate, 21, has mounted thereon a capacitor, 22. The capacitor has external terminations, 26. Each capacitor has at least two external terminations and at least two external terminations are of opposing polarity. A PCB, 31, is mounted below the interposer with connectors, 35, in direct electrical contact with a connector, 23, and each external termination, 26, of the capacitor 22. A signal trace, 32, of the PCB provides a signal to a component, 28, of the IC through the conductive path formed by the connectors, 35, 23, and 27. Power is supplied from a power trace, 33, and to a ground trace, 34, through the external terminations of the capacitor, 22, and the respective connectors. In this configuration power is supplied directly through the terminations, 26, of the capacitor and directly through conduction paths, 30, of the interposer. By directly coupling the power through the capacitor the power and ground are decoupled, as well as electronically filtered. This direct decoupling reduces or eliminates the necessity of dedicated connectors and circuit traces between the capacitor and the dedicated connectors thereby minimizing the footprint of the interposer as well as simplifying subsequent assembly of the configuration.

It is preferred that the interposer have the same connector arrangement as the IC and PCB such that the interposer can be positioned between the IC and PCB with minimal increase in total circuit volume.

Figure 5:
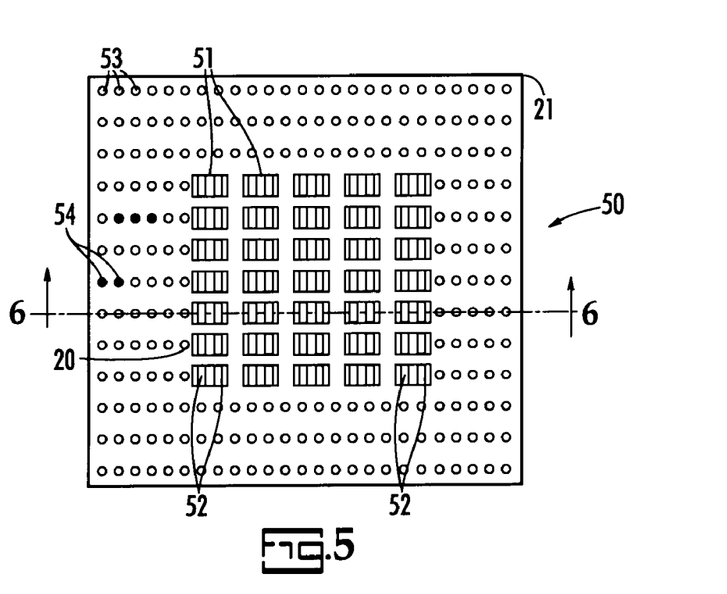
FIG. 5 is a front view schematic representation of an embodiment of the present invention.
Figure 6:
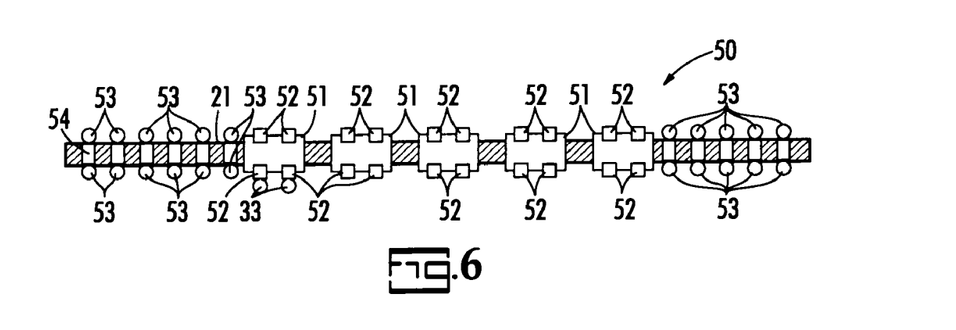
FIG. 6 is a cross-sectional schematic view taken along line 6-6 of FIG. 6.

A monolithic interposer of the invention is represented in top view in FIG. 5 and in cross-sectional view taken along line 6-6 in FIG. 6. The interposer, generally represented at 50, comprises a substrate, 21. A multiplicity of capacitors, 51, are integral to the substrate such that each capacitor termination, 52, is accessible above and below the substrate. Each capacitor termination is directly coupled to the IC, or IC package, on one side and PCB on the other such that the circuit path is directly through at least one capacitor. The remaining connections, 53, are preferably a connective array such as a ball grid array (BGA), land grid array (LGA) or the like. The interposer comprises a conduction path, 54, passing there through such that solder balls on opposing sides are electrically connected. It is preferred that at least one conduction path is a signal conduction path. In one embodiment at least one conduction path, 54, is a functional conductive path which is at least one of a resistive connector, an inductive connector, fused link, balum or a varistor connector.

Figure 7:
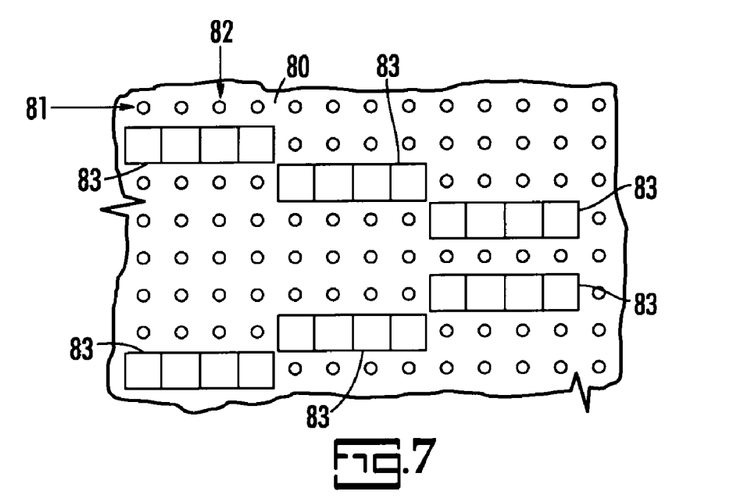
FIG. 7 is a partial top view schematic representation of an embodiment of the present invention.

An embodiment of the invention is illustrated in partial top view in FIG. 7. In FIG. 7, the interposer, 80, comprises rows, 81, and columns, 82, of connectors interrupted by capacitors, 83. The capacitors are arranged such that each capacitor is offset by at least one row and at least one column from each adjacent capacitor. An adjacent capacitor is the closest capacitor in a row or column. By offsetting each capacitor by at least one row and at least one column the cross-talk between signal or functional input/outputs (I/Os) may be significantly reduced.

Figure 8:
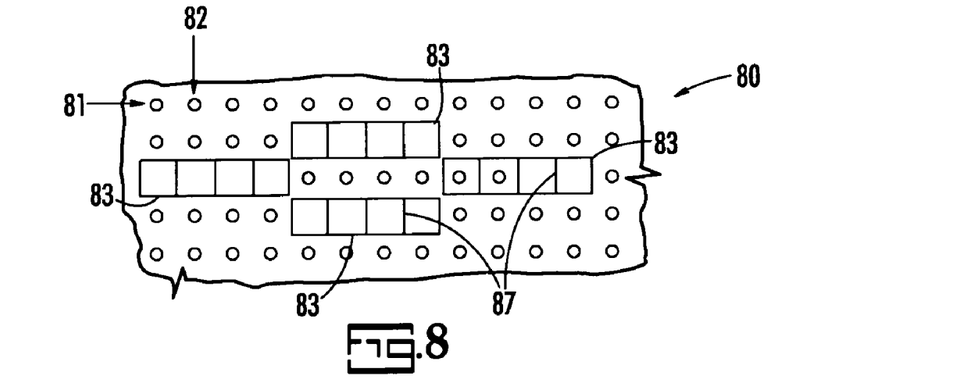
FIG. 8 is a partial top view schematic representation of an embodiment of the present invention.

Another embodiment of the invention is illustrated in partial view in FIG. 8. In FIG. 8 the interposer, 80, rows, 81, columns, 82, and capacitors, 83, are as described relative to FIG. 8. In each case the adjacent capacitors are offset by at least one row and by at least one column. The capacitors may also be arranged with the closest points of adjacent capacitors having common polarity or they may be in a checkerboard pattern.

The terms above, below, upper and lower are relative non-limiting terms used for clarity in discussion which could be reversed without consequence.

Figure 9:
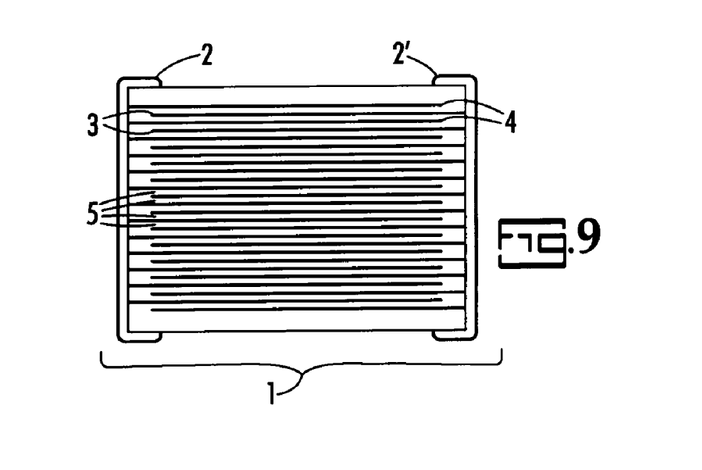
FIG. 9 is a cross-sectional schematic representation of the present invention.

The configuration of multilayer capacitors is well known in the art. With reference to FIG. 9, an exemplary structure of a multilayer ceramic chip capacitor, 1, is shown. External electrodes, 2 and 2', forming the terminations of the capacitor, 1, are disposed on side surfaces of the capacitor block structure, 1, and in electrical connection to internal electrode layers, 3 and 4. The capacitor chip, 1, has a plurality of stacked electrode layers, 3 and 4, such that alternating electrodes extend to opposite external electrodes. A dielectric material, 5, interleaves these internal electrode layers forming an insulative and electrical field enhancement between the areas created by these overlapping electrode planes.

Connectors as referred to herein include all standard connective techniques employed between an IC, or IC package, and a PCB with, or without, an interposer there between. Without limit connectors refer to solder pads, land grid arrays, ball grid arrays, controlled collapse chip connection (C4), pin, socket and combinations thereof.

The conduction path in the interposer refers to any structure which allows current, or signal, to flow from a connector on one face to a conductor opposite thereto. It is preferred that the conduction path span the shortest distance between the opposing connectors.

A resistive connector partially opposes passage of electrical current. The application in circuitry is well known to those of skill in the art. For the purposes of the present invention a resistive connector has a resistance of at least $10^{-6}$ ohm to no more than $10^{10}$ ohm.

An inductive connector increases inductance, or magnetic flux, which opposes changes in current. For the purposes of the present invention an inductive connector has an inductance of at least 1 pH to no more than 1 H.

A varistor connector is an electronic connection with significant non-ohmic current-voltage characteristics. A varistor, also referred to as a voltage dependent resistor or variable resistor, shunts current created by high voltage away from sensitive components.

A balun is a passive electronic device that converts between balanced and unbalanced electrical signals. They often also change impedance and typically involve some form of electromagnetic coupling.

A fuse, also referred to herein as a fused link, is a type of over current protection device. In one embodiment an essential component is a metal wire or strip that melts with excess current flow. When the metal strip melts it opens the circuit of which it's a part and protects the surface from excessive current. These are typically referred to as irreversible fuses. Other embodiments include reversible fuses wherein the fuse opens during overcurrent and closes once the overcurrent situation has passed.

A capacitor, often referred to as a condenser, is an electrical device that can store energy in the electric field between a pair of conductors, or plates.

Figure 10:
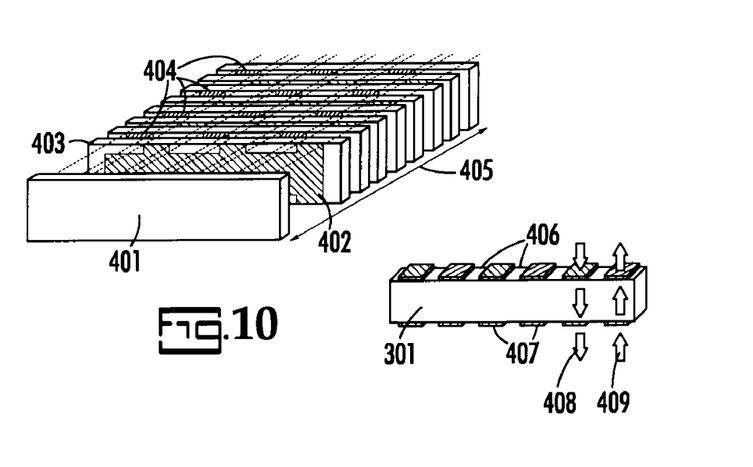
FIG. 10 is a schematic representation of a capacitor of the present invention.

The power feed-through capacitor is preferably prepared as described in U.S. Pat. No. 7,068,490 which is incorporated herein by reference. As illustrated in FIG. 10 individual dielectric layers or material, 401, are stacked in a multilayer fashion with the electrode patterns, 402, creating the capacitive layers and edge connectors at the top and bottom of the device. The electrode pattern, 402, is created to allow the multiple edge connectors on the same plate to terminate to non-adjacent termination pads, 406 or 407, with adjacent termination pads connecting to adjacent electrode layers. The stacking arrangement is completed to as maximum a depth, 405, as required for the application of interest. The stacked layers are then pressed (and fired if ceramic) into a singular element, 301, referred to herein as subunits. Termination pads at the top and bottom faces of the element are formed as known in the art. The termination pads are created as metallic contacts that allow connection to the circuit, as well as connecting the non-adjacent electrodes of the stack, 404, into a common or parallel arrangement. The common electrical state of the opposing termination pads is preferred for two purposes; they allow the shortest possible path for the current to feed through the device and they allow the shortest possible path for heat conduction through the device. The current feed in (408) and out (409) through the device is shown by arrows.

Figure 11A:
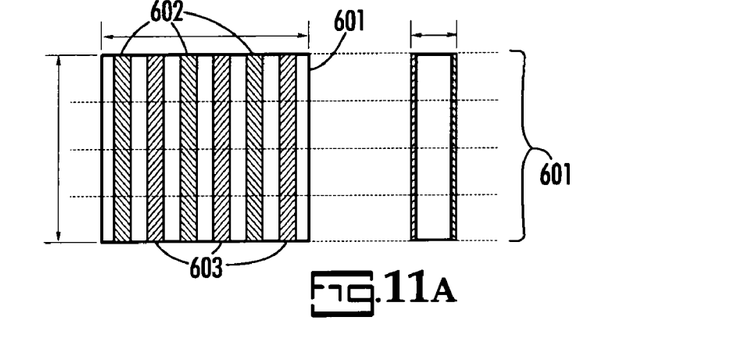
FIG. 11 is a schematic representation of a capacitor of the present invention.
Figure 11B:
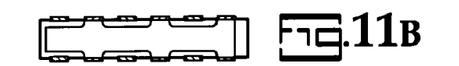
Figure 11C:
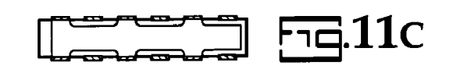
Figure 11D:
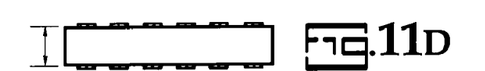
Figure 11E:
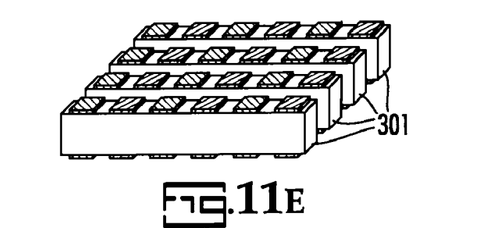

The requirements of decoupling state of the art IC-based microprocessors demand a great deal of charge availability virtually instantaneously in order to ensure stability of current to the IC. This requires a substantial amount of capacitance local to the IC with minimal impedance (inductance) in the current path to the IC. As such, the device may not be sufficient to handle the current through the limited pad arrangements on each face, but could be mounted as multiple singular elements, or as assembled multiple units. In FIG. 11(a), four elements, 301, distinguished by dotted lines, are bonded or arranged together to create a larger device, 601, with broader linear contacts, 602 and 603. This assembly can be fabricated either by bonding or arranging multiple units, 301, together after each element has reached a final state, or assembled before the termination pads are applied. For ceramic chips, this structure could even be created with green chips using ceramic slurry or the like as an adhesive before the final sintering for the ceramic dielectric. Alternatively, an adhesive, or molding operation, or assembly to a frame and the like can be incorporated after sintering of the subunits. The plate designs, typically referred to as "A" and "B" plates, are illustrated in FIGS. 11(b) and 11(c) which, when taken together, form the internal electrode plates of the element, 310. Four subunits are illustrated in exploded view in FIG. 11(d) wherein the subunits are taken together to form the capacitor of FIG. 11(a).

Figures 12A, 12B:
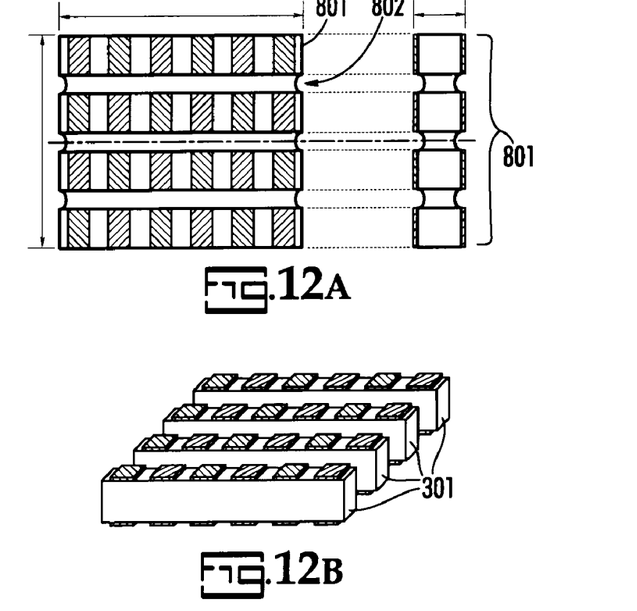
FIG. 12 is a schematic representation of a capacitor of the present invention.
Figure 12C:
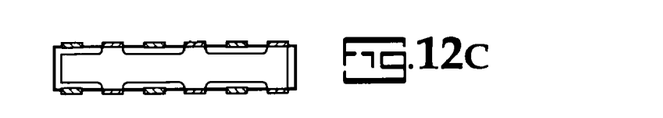
Figure 12D:
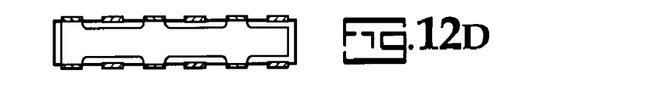
Figure 12E:
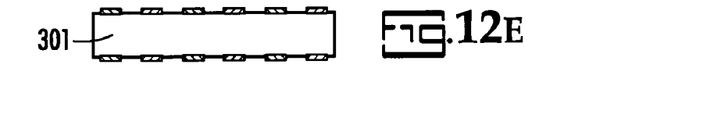

In FIG. 12(a), the assembly, 801, of individual elements, 301, has a bonding agent, 802, between the elements to allow a separation or isolation of the termination pads from one element to the other. This arrangement allows for a fully interdigitated matrix of "power" and "ground" termination pads for the assembly, 801. The capacitor of FIG. 12(a) is shown in side view in FIG. 12(b). The bonding agent can be any suitable adhesive including organic adhesives, molded thermoplastics, molded thermosets, or the like or a combination thereof, or ceramic slurry adhesives or the like or any combination thereof.

It is preferred that the capacitor is mounted to the interposer with the internal plates perpendicular to the face of the interposer surface.

Figure 13:
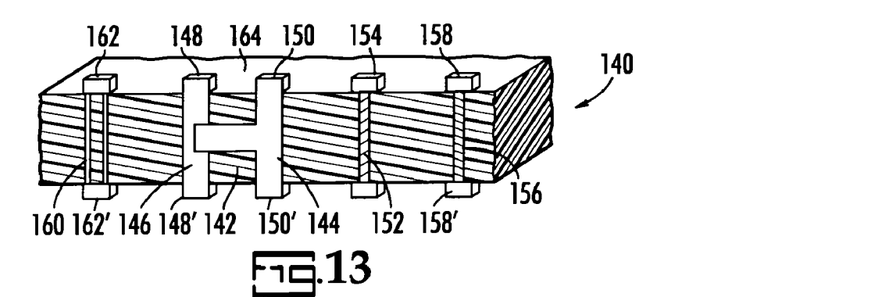
FIG. 13 is a schematic representation of a monolithic interposer of the present invention.

A portion of a monolithic interposer of the present invention is illustrated in cross-sectional view in FIG. 13. In FIG. 13, the monolithic interposer, generally represented at 140, comprises multiple functionalities. A feed-through capacitor, 142, comprises first plates, 144, and second plates, 146, separated by a dielectric which is not shown in this view. Each plate has lead-out tabs which are in direct electrical contact with external terminations, 148 and 150. Direct electrical contact is defined herein to exclude circuit traces between the lead out tabs and external terminations. It would be apparent from the discussion herein that a pair of opposing external terminations, 148 and 148' for example, are for power and the external terminations of opposite polarity, 150 and 150' for example, are connected to an electrical ground. Other functionality is incorporated into the monolith. For example functional material, 152, between opposing external terminations, 154, may provide resistance, inductance, a fused link or function as a balun. Another functional material, 156, between opposing terminations, 158, may have low resistivity and function to pass signal or current directly through the interposer with minimal loss of signal fidelity. Parallel plates, 160, separated by a dielectric may provide a capacitive couple between opposing terminations 162. The entire monolith may be encased in a non-conductive material, 164.

This structure could also be utilized in electrolytic capacitors where the dielectric would be formed as an anodization on each electrode plate, or alternate electrode plates, and the dielectric in this structure is replaced by a conductive or semiconductive material. The electrode with the anodization would create the anode contact or termination, and the opposing termination would create the cathode termination. By anodizing adjacent electrode plates, a non-polar electrolytic could also be created. A desired capacitor circuit is completed in this way.

The subunits are typically about 0.1 to 2 mm wide and 0.11 to 4 mm thick (excluding termination pads) and 1 to 10 mm long. Typically about 2 to 200 subunits are combined into the assembly with about 100 being preferred. The termination pads are separated by a sufficient distance to avoid arcing between pads as well as to accommodate the terminal pad spacing of the top and bottom circuits of assembly (typically the IC package on top and the PCB on the bottom). A separation of at least about 0.005 mm is preferred with 0.5 mm to 1 mm being more preferred.

The dielectric layers may have any desired mean grain size. By limiting the dielectric material to the above-defined composition, there are obtained fine crystal grains which typically have a mean grain size of about 0.05 to about 3.0 $\mu$m. The conductive plates are separated by a dielectric as well known in the art and described in U.S. Pat. Nos. 7,211,740; 7,172,985; 7,164,573; 7,054,137; 7,068,490 and 6,906,907 each of which is incorporated herein by reference. Conductive plates separated by a dielectric forms a capacitor as known in the art.

The dielectric layers have an appropriate Curie temperature which is determined in accordance with the applicable standards by suitably selecting a particular composition of dielectric material. Typically the Curie temperature is higher than 45° C., especially about 65° C. to 125° C.

Each dielectric layer preferably has a thickness of up to about 50 $\mu$m, more preferably up to about 10 $\mu$m. The lower limit of thickness is about 0.2 $\mu$m, preferably about 1.5 $\mu$m. The number of dielectric layers stacked is generally from 2 to about 500, preferably from 50 to about 250.

The conductor which forms the internal electrode layers is not critical, although a base metal preferably is used since the dielectric material of the dielectric layers has anti-reducing properties. Typical base metals are nickel, copper, titanium, tungsten, molybdenum, alloys or cermets of base metals or base metal alloys with nickel being preferred. Preferred nickel alloys are alloys of nickel with at least one member selected from Cu, Si, Ba, Ti, Mn, Cr, Co, and Al, with such nickel alloys containing at least 95 wt % of nickel being more preferred. It is to be noted that nickel and nickel alloys may contain up to about 0.1 wt % of phosphorous and other trace components.

The thickness of the internal electrode layers may be suitably determined in accordance with a particular purpose and application although its upper limit is typically about 5 $\mu$m, preferably about 2.5 $\mu$m, and its lower limit is typically about 0.2 $\mu$m, preferably about 1.3 $\mu$m.

The conductor which forms the external electrodes is not critical, although inexpensive metals such as nickel, copper, and alloys thereof are preferred. The thickness of the external electrodes may be suitably determined in accordance with a particular purpose and application although it generally ranges from about 5 $\mu$m to about 100 $\mu$m.

The multilayer ceramic chip capacitor of the present invention generally is fabricated by forming a green chip by conventional printing and sheeting methods using pastes, firing the chip, and printing or transferring external electrodes thereto followed by baking.

Paste for forming the dielectric layers can be obtained by mixing a raw dielectric material with an organic or aqueous vehicle. The raw dielectric material may be a mixture of oxides and composite oxides as previously mentioned. Also useful are various compounds which convert to such oxides and composite oxides upon firing. These include, for example, carbonates, oxalates, nitrates, hydroxides, and organometallic compounds. The dielectric material is obtained by selecting appropriate species from these oxides and compounds and mixing them. The proportion of such compounds in the raw dielectric material is determined such that after firing, the specific dielectric layer composition may be met. The raw dielectric material is generally used in powder form having a mean particle size of about 0.1 to about 3 $\mu$m, preferably about 0.5 $\mu$m. Dielectrics are well known and not limited herein.

The vehicle is a binder in solvent. The binder used herein is not critical and may be suitably selected from conventional binders such as ethyl cellulose or the like. Also the solvent used herein is not critical and may be suitably selected from conventional solvents such as water, terpineol, butylcarbinol, acetone, and toluene in accordance with a particular application method such as a printing, coating or sheeting method.

Paste for forming internal electrode layers is obtained by mixing an electro-conductive material with an organic or aqueous vehicle. The conductive material used herein includes conductors such as conductive metals and alloys as mentioned above and various compounds which convert into such conductors upon firing, for example, oxides, organometallic compounds and resonates. The organic vehicle is as mentioned above.

Paste for forming external electrodes is prepared by the same method as the internal electrodes layer-forming paste.

No particular limit is imposed on the vehicle content of the respective pastes mentioned above. Often the paste contains about 1 to 5 wt % of the binder and about 10 to 50 wt % of the solvent. If desired, the respective pastes may contain any other additives such as dispersants, plasticizers, dielectric compounds, and insulating compounds. The total content of these additives is preferably up to about 10 wt %.

A green chip then may be prepared from the dielectric layer-forming paste and the internal electrode layer-forming paste. In the case of printing method, a green chip is prepared by alternately printing the pastes onto a substrate of polyethylene terephthalate (PET), for example, in laminar form, cutting the laminar stack to a predetermined shape and separating it from the substrate.

Also useful is a sheeting method wherein a green chip is prepared by forming green sheets from the dielectric layer-forming paste, printing the internal electrode layer-forming paste on the respective green sheets, and stacking the printed green sheets.

The binder is then removed from the green chip and fired. Binder removal may be carried out under conventional conditions, preferably under the following conditions where the internal electrode layers are formed of a base metal conductor such as nickel and nickel alloys.

The heating rate may be 1 to 300° C./hour and more preferably 2 to 100° C./hour. The holding temperature may be 200 to 900° C. and more preferably 220 to 300° C. The holding time may be ½ to 100 hours and more preferably 2 to 20 hours. The atmosphere is preferably air but may contain mixtures of air, hydrogen and nitrogen. The green chip is fired in an atmosphere which may be determined in accordance with the type of conductor in the internal electrode layer-forming paste. Where the internal electrode layers are formed of a base metal conductor such as nickel and nickel alloys, the firing atmosphere may have an oxygen partial pressure of $10^{-3}$ to $10^{-18}$ atm. Extremely low oxygen partial pressure should be avoided, since at such low pressures the conductor can be abnormally sintered and may become disconnected from the dielectric layers. At oxygen partial pressures above the range, the internal electrode layers are likely to be oxidized.

For firing, the chip preferably is held at a temperature of 1,000° C. to 1,400° C., more preferably 1,100 to 1,400° C. Lower holding temperatures below the range would provide insufficient densification whereas higher holding temperatures above the range can lead to poor DC bias performance. Remaining conditions for sintering preferably are as follows. The heating rate may be 5 to 500° C./hour and more preferably 20 to 300° C./hour. The holding time may be 0.1 to 24 hours and more preferably 1 to 3 hours. The cooling rate may be 5 to 500° C./hour and more preferably 200 to 300° C./hour. The firing atmosphere is preferably a reducing atmosphere. An exemplary atmospheric gas is a humidified mixture of $N_2$ and $H_2$ gases.

Firing of the capacitor chip in a reducing atmosphere preferably is followed by annealing. Annealing is effective for re-oxidizing the dielectric layers, thereby optimizing the resistance of the ceramic to dielectric breakdown. The annealing atmosphere may have an oxygen partial pressure of at least $10^{-8}$ atm., preferably $10^{-5}$ to $10^{-4}$ atm. The dielectric layers are not sufficiently re-oxidized at partial pressures below the range, whereas the internal electrode layers are likely to be deleteriously oxidized at oxygen partial pressures above this range.

For annealing, the chip preferably is held at a temperature of lower than 1,100° C. and more preferably 500° C. to 1,000° C. Lower holding temperatures below the range would oxidize the dielectric layers to a lesser extent, thereby leading to a shorter life performance of the chip. Higher holding temperatures above the range can cause the internal electrode layers to be oxidized (leading to a reduced capacitance) and to react with the dielectric material (leading to a shorter life performance). Annealing can be accomplished simply by heating and cooling. In this case, the holding temperature is equal to the highest temperature on heating and the holding time is zero. Preferred conditions for annealing include a holding time of 0 to 80 hours, more preferably 6 to 10 hours, and a cooling rate or 5 to 500° C./hour and more preferably 100 to 300° C./hour.

The preferred atmospheric gas for annealing is humid nitrogen gas. The nitrogen gas or a gas mixture used in binder removal, firing, and annealing, may be humidified using a wetter. In this regard, water temperature preferably is about 5 to 75° C.

The binder removal, firing, and annealing may be carried out either continuously or separately. If done continuously, the process includes the steps of binder removal, changing only the atmosphere without cooling, raising the temperature to the firing temperature, holding the chip at that temperature for firing, lowering the temperature to the annealing temperature, changing the atmosphere at that temperature, and annealing.

If done separately, after binder removal and cooling down, the temperature of the chip is raised to the binder-removing temperature in dry or humid nitrogen gas. The atmosphere then is changed to a reducing one, and the temperature is further raised for firing. Thereafter, the temperature is lowered to the annealing temperature and the atmosphere is again changed to dry or humid nitrogen gas, and cooling is continued. Alternately, once cooled down, the temperature may be raised to the annealing temperature in a nitrogen gas atmosphere. The entire annealing step may be done in a humid nitrogen gas atmosphere.

The resulting chip may be polished at end faces by barrel tumbling and sand blasting, for example, before the external electrode-forming paste is printed or transferred and baked to form external electrodes. Firing of the external electrode-forming paste may be carried out under the following conditions: a humid mixture of nitrogen and hydrogen gases, about 600 to 800° C., and about 10 minutes to about 1 hour.

Pads are preferably finished on the external electrodes by plating or other methods known in the art.

The multilayer ceramic chip capacitors are then assembled into an array configuration as described, via means of adhesion, molding, overmolding, framing or other suitable ganging processes. The functional and conductive circuit elements are added to the ganged capacitive device either concurrently or subsequently to ganging of the capacitive units, using frame array technology or other means suitable to achieving the desired array configuration. The invention can be mounted on printed circuit boards, for example, by soldering or by electrically conductive adhesive (ECA) attach or by mechanical interconnect as in the case of a removable connector.

The present invention has been described with particular reference to the preferred embodiments. It would be apparent from the description herein that other embodiments could be realized without departing from the scope of the invention which is set forth in the claims appended hereto.

The invention claimed is:

1. An interposer comprising:
a first planar face and a second planar face;
an array of upper connections on said first planar face and opposing lower connections on said second planar face with conductivity paths between each upper connection of said upper connections and a lower connection of said lower connections wherein at least one connectivity path has functionality selected from a resistor, an inductor, a varistor, a fuse, a balun and a capacitor;
at least one feed-through capacitor comprising:
a plurality of parallel plates with a dielectric there between;
at least one first external termination in electrical contact with a first set of alternate parallel plates; and
at least one second external termination in electrical contact with a second set of alternate parallel plates;

said capacitor is electrically or physically connected to said first planar face with said first external termination in electrical contact with a first upper connection and said second external termination is in electrical contact with a second upper connection; and at least one upper connection, said first external termination and said second external termination arranged for direct electrical contact with element contact pads of a common element.

2. The interposer of claim 1 wherein said common element is selected from an integrated circuit and a printed circuit board.

3. The interposer of claim 2 further comprising one of an integrated circuit, an integrated circuit package and a printed circuit board in direct electrical contact with said lower pads.

4. The interposer of claim 1 wherein at least one said upper connection comprises at least one of a pin, a socket, a land grid, a wire bond, a solder pad or a solder ball.

5. The interposer of claim 1 wherein at least one said lower connection comprises at least one of a pin, a socket, a land grid, a wire bond, a solder pad or a solder ball.

6. The interposer of claim 1 wherein said resistor has a resistance of at least $10^{-6}$ ohm to no more than $10^{10}$ ohm.

7. The interposer of claim 1 wherein at least once connectivity path has functionality selected from a resistor, an inductor, a fuse, and a capacitor.

8. The interposer of claim 1 wherein said functionality is between said first external termination and said first upper connection.

9. The interposer of claim 1 wherein said array of upper connections comprises rows and columns.

10. The interposer of claim 9 further comprising multiple capacitors wherein each capacitor of said multiple capacitors is offset by at least one row and at least one column of said array of upper connections.

11. The interposer of claim 1 wherein said parallel plates of said feed through capacitor are perpendicular to said first planar face.

12. An electronic package comprising:
    an integrated circuit comprising an array of IC contacts;
    a printed circuit board comprising an array of PCB contacts; and
    an interposer of claim 1 between said integrated circuit and said printed circuit board.

13. An electronic device comprising:
    an electronic package comprising:
        an integrated circuit comprising an array of IC contacts;
        a printed circuit board comprising an array of PCB contacts; and
    an interposer of claim 1 between said integrated circuit and said printed circuit board.

14. The interposer of claim 1 wherein said parallel plates are perpendicular to said first planar face.

* * * * *